(12) United States Patent
Tucker et al.

(10) Patent No.: US 10,447,224 B2
(45) Date of Patent: Oct. 15, 2019

(54) LINE FILTER AND METHOD OF INSTALLING A LINE FILTER ONTO A SYSTEM CABLE

(71) Applicant: EPCOS AG, Munich (DE)

(72) Inventors: Andrew Tucker, Quarry Hill (AU); Norbert Jarfas, Szombathely (HU)

(73) Assignee: Epcos AG, Munich (DE)

( * ) Notice: Subject to any disclaimer, the term of this patent is extended or adjusted under 35 U.S.C. 154(b) by 192 days.

(21) Appl. No.: 15/525,576

(22) PCT Filed: Oct. 30, 2015

(86) PCT No.: PCT/EP2015/075320
§ 371 (c)(1),
(2) Date: May 9, 2017

(87) PCT Pub. No.: WO2016/074955
PCT Pub. Date: May 19, 2016

(65) Prior Publication Data
US 2017/0338787 A1  Nov. 23, 2017

(30) Foreign Application Priority Data
Nov. 10, 2014  (EP) .................................. 14192512

(51) Int. Cl.
*H03H 1/00* (2006.01)
*H01R 4/2408* (2018.01)
(Continued)

(52) U.S. Cl.
CPC ........... *H03H 1/0007* (2013.01); *H01F 27/28* (2013.01); *H01R 4/2408* (2013.01); *H01R 9/031* (2013.01);
(Continued)

(58) Field of Classification Search
CPC .......... H03H 1/0007; H03H 2001/0092; H01F 27/28; H01R 4/2408; H01R 9/031; H01R 13/719; H02M 1/126
(Continued)

(56) References Cited

U.S. PATENT DOCUMENTS 5,461,351 A   10/1995  Shusterman
5,630,734 A    5/1997  Phillips, Jr.
(Continued)

FOREIGN PATENT DOCUMENTS

CN        1993864 A    7/2007
CN      101073185 A   11/2007
(Continued)

*Primary Examiner* — Benny T Lee
*Assistant Examiner* — Hafizur Rahman
(74) *Attorney, Agent, or Firm* — Morgan, Lewis & Bockius LLP

(57) ABSTRACT

The present invention concerns a line filter (1), which is configured to be installed onto a system cable (2), wherein the line filter (1) comprises a magnetic component (4), wherein the line filter (1) defines a cable path (6) through the line filter (1), wherein the line filter (1) is configured to allow a placement of the system cable (2) along the cable path (6) at the time of an installation, thereby providing a magnetic coupling of the system cable (2) to the magnetic component (4), and wherein the line filter (1) comprises an insulation displacement connector (16) and a shunt component (5) wherein the insulation displacement connector (16) is configured to be tightened at the time of the installation, thereby providing a galvanic connection of the system cable (2) to the shunt component (5). Further, the present invention concerns a method of installing a line filter (1) onto a system cable (2).

15 Claims, 3 Drawing Sheets

(51) Int. Cl.
*H02M 1/12* (2006.01)
*H01F 27/28* (2006.01)
*H01R 9/03* (2006.01)
*H01R 13/719* (2011.01)

(52) U.S. Cl.
CPC .......... *H02M 1/126* (2013.01); *H01R 13/719* (2013.01); *H03H 2001/0092* (2013.01)

(58) Field of Classification Search
USPC ........................................................ 333/181
See application file for complete search history.

(56) References Cited

U.S. PATENT DOCUMENTS

| | | |
|---|---|---|
| 2005/0280484 A1 | 12/2005 | McLauchlan et al. |
| 2006/0157401 A1 | 7/2006 | Fuerst |
| 2006/0172593 A1* | 8/2006 | Kobayashi ............. H01F 17/06 439/559 |
| 2008/0100400 A1 | 5/2008 | Lucas |
| 2010/0182100 A1* | 7/2010 | Tucker ................... H02M 1/12 333/181 |

FOREIGN PATENT DOCUMENTS

| | | |
|---|---|---|
| CN | 201877579 U | 6/2011 |
| GB | 2153165 A | 8/1985 |
| GB | 2354118 A | 9/1999 |
| JP | 2002305422 A | 10/2002 |
| JP | 2004-147226 A | 5/2004 |
| JP | 2012129631 A | 7/2012 |
| WO | 0060701 A1 | 10/2000 |
| WO | WO-2006007321 A2 | 1/2006 |
| WO | WO-2006020396 A1 | 2/2006 |
| WO | 2006076680 A1 | 7/2006 |

* cited by examiner

LINE FILTER AND METHOD OF INSTALLING A LINE FILTER ONTO A SYSTEM CABLE

SUMMARY

The present invention concerns a line filter and a method of installing the line filter onto a system cable. A line filter is a kind of electronic filter that is placed between an electronic device and an external line, or placed in any line interconnecting electronic devices within a system. A line filter is usually used to attenuate conducted radio frequencies (RFI), also known as electromagnetic interference (EMI) between the external line and the electronic device, or between electronic devices within a system.

The installation of line filters to system cables requires a high level of expertise and is time-consuming. The quality of the connection is vital to ensure adequate conduction of the system current to avoid overheating of the termination. Usually, the line filters comprise a field wiring power terminal at the line side and another field wiring power terminal at the load side. The terminals are configured to be connected with a system cable input and a system cable output. In a three-wire-system, for example, this requires six system cable terminations each capable of carrying the full system current. For each termination the system cable must be prepared with the correct length of insulation removal, the wire end finished with a suitable sleeve and the cable fastened to the terminal with the correct torque. Periodically this torque must be re-checked.

It is an object of the present invention to provide an improved line filter, e.g. which facilitates the installation. Another object of the present invention is to provide an improved method of installing a line filter onto a system cable.

The object is solved by the line filter according to claim 1. The further object is solved by the method according to the second independent claim.

A line filter is provided which is configured to be installed onto a system cable, wherein the line filter comprises a magnetic component, the line filter defines a cable path through the line filter, the line filter is configured to allow placement of the system cable along the cable path at the time of an installation, thereby providing a magnetic coupling of the system cable to the magnetic component, and wherein the line filter comprises an insulation displacement connector and a shunt component wherein the insulation displacement connector is configured to be tightened at the time of the installation, thereby providing a galvanic connection of the system cable to the shunt component.

In this context, the term "at the time of an installation" may refer to the installation of the line filter to a system cable of an external electronic device. The time of the installation is not a time during the manufacturing of the line filter. The system cable is not an intrinsic part of the line filter. The line filter is installed onto the system cable at a point in time after the manufacturing of the line filter, and by a person different from the manufacturer, in particular e.g. by an installer or user of the electronic device.

The line filter may be a low pass filter. The line filter may be configured to attenuate radio frequency interference, also known as electromagnetic interference (EMI). The line filter may be configured to attenuate a leakage current. The line filter may be configured to be connected between a power grid and an electrical load device or between electrical devices within a system, i.e. between a motor drive and motor. The line filter may provide electromagnetic compatibility (EMC) between devices.

The line filter may comprise a means for eliminating earth leakage current from the system cable in the frequency range 150 Hz to 150 kHz. Alternatively, the line may comprise series inductive and shunt capacitive components in a ladder network to provide attenuation of radio frequency interference in the frequency range 150 kHz to 30 MHz.

The magnetic component may be an inductor core.

The cable path may be a predefined path which extends through the line filter. In particular, the cable path may connect a line side of the line filter to a load side of the line filter.

In this context the term "placement of the system cable along the cable path" may be understood as an operation carried out by a user of the line filter or by an installer of the line filter. In this operation, the system cable may be placed manually along the cable path. In one embodiment, the system cable may be placed along the cable path by pushing the system cable through the line filter. However, alternative embodiments for the placement the cable along the cable path are also possible.

The insulation displacement connector (IDC) is configured to provide a galvanic connection of the system cable to the shunt component. In particular, the IDC is configured to provide a voltage tap into the system cable which allows a small shunt current to be drawn from the system cable to the shunt component. Thereby, the same voltage may apply in the system cable and at the shunt component.

The shunt component may comprise one or more shunt capacitors. The shunt component may be connected between the system cable and a grounding terminal, or between phases of the system cables. The line filter may comprise multiple shunt components which are connected in a ladder topology.

As the line filter is configured to be magnetically coupled and galvanically connected to the system cable at the time of an installation onto the system cable, the line filter is free from an internal main power conductor connecting a line terminal and a load terminal. Instead, the system cable which is placed along the cable path at the time of installation directly connects with the magnetic components and the IDC. Thereby, the provision of field wiring terminals on the line filter is completely unnecessary and this results in saving on their inherent cost and bulk. This facilitates the field wiring for installation of the line filter and the time-consuming preparation of the system cabling for termination. Accordingly, the operation of installing the line filter onto a system cable is significantly facilitated.

In one embodiment, the line filter comprises an aperture which is configured to allow placement of the system cable along the cable path by pushing the system cable through the aperture at the time of installation. Pushing the system cable through an aperture to enter into the line filter and providing another aperture through which the system cable can exit the line filter is a particularly easy way of installing the line filter onto the system cable. This allows a very fast installation and improves the user safety as installation errors, such as poor high current connections, are prevented.

The IDC may comprise a screw and at least one conductive pin which is configured to pierce into the system cable when the screw is tightened. The IDC may comprise exactly one conductive pin. Alternatively, the IDC may comprise multiple conductive pins.

In particular, the conductive pin may be configured to displace the insulation of the system cable. Accordingly, it is possible to de-install the line filter from the system cable by untightening the screw wherein the pin can be withdrawn from the system cable and the insulation sustains only minor damage.

The pin may either be arranged to the end of the screw which is configured to face towards the system cable or the pin may be arranged such that it is on the side of the system cable which is opposite to the screw when the line filter installed onto the system cable.

The conductive pin may be configured to pierce the system cable insulation and to protrude into the system cable a depth in the range of a fraction of a millimeter to several millimeters. In particular, the depth may be in the range of 0.01 mm to 20 mm. The system cable may comprise an inner conductor which is covered by an insulation. The conductive pin may be configured to pierce through the insulation and enter into the inner conductor.

The depth by which the pin is designed to enter into the system cable can be adjusted to provide different conductivity characteristics for the galvanic connection of the IDC.

The magnetic component may be ring-shaped and comprise an opening. The cable path may pass through the opening of the magnetic component. The magnetic component may be configured to reinforce a magnetic flux which is created by a current flowing through the system cable passing through the opening of the magnetic component. Thereby, the magnetic coupling between said two elements may be increased.

The line filter may be free from an internal conductor winding. Accordingly, the cable may follow a direct path through the line filter. Thus, the cable path may be configured such that the system cable may be guided through the line filter in an almost straight line. This facilitates the placement of the system cable along the cable path by pushing. In particular, minimal deformation or twists of the system cable may be required while pushing the system cable along the straight line.

The IDC may be configured to draw a shunt current from the system cable through the galvanic connection of the system cable to the shunt component wherein the shunt current is lower than a power current flowing through the system cable. In particular, the shunt current may be orders of magnitude lower than a current flowing through the system cable. The line filter shunt components may be designed to draw a relatively low current compared with a power current flowing through the system cable. Accordingly, the power current can be very high and will sustain no attenuation whereas radio frequency interference shunt current is removed from the system cable.

The shunt current may in the range of 0.1 A to 10 A. At the same time, the current flowing through the system cable may be up to 1000 A. In particular, the current in the system cable may be in the range of 10 A to 1000 A. A voltage of up to 600 V may be present in the system cable. The line filter may be designed to provide attenuation in the frequency range 1 kHz to 30 MHz.

The line filter may comprise multiple IDCs wherein each of the IDCs is configured to be tightened at the time of the installation, thereby providing galvanic connections of the system cable to the shunt component. In particular, the line filter may be configured to be installed onto a system cable which comprises one or more phases. The line filter may be configured such that all phases of the system cable are magnetically coupled to the same magnetic component when the system cable is placed along the cable path, or individual phases may couple to separate magnetic components. Further, the line filter may be configured to galvanically connect each phase of the system cable to at least one insulation displacement connector. This design allows to galvanically connect the different phases of the system cable individually. For example, the respective IDCs may be designed differently.

Moreover, the line filter may comprise multiple IDCs which are configured to be connected to the same phase of the system cable. This may allow drawing stronger shunt current, or may allow the connection of multiple stages of shunt component.

The line filter may further comprise a guiding element which is configured to mechanically guide the system cable along the cable path during the placement of the system cable along the cable path and which is configured to hold the system cable in the cable path once the system cable is placed along the cable path. The guiding element may be a plastic component.

The line filter may be a low pass filter.

The IDC may be configured to be connected to the system cable in a gas-tight connection.

The IDC may be configured to provide a strain-relief when connected to the system cable.

The IDC may be configured to provide a spring action which will maintain a constant clamping force over time.

The line filter may be configured to be deinstalled from the system cable. In particular, the line filter may be de-installed from the system cable by opening the IDC and by removing the system cable from the cable path, e.g. by pulling the system cable out of the line filter. The line filter may be configured such that during the deinstallation from the system cable, the system cable sustains minimal damage where the insulation is pierced but remains intact. The de-installation can be carried out by qualified user or installer.

The line filter may comprise a housing wherein the insulation displacement connector is configured to pierce into the system cable at a position which is arranged inside the housing. Accordingly, the spot at which the system cable is pierce by the insulation displacement connector may be protected by the housing.

The cable path extends through the housing. The magnetic component may be arranged inside the housing. The insulation displacement connector may be arranged inside the housing. In particular, the insulation displacement connector may be arranged completely inside the housing. The shunt component may be arranged inside the housing.

According to another aspect, the present invention relates to an assembly comprising the above-described line filter and the system cable.

Further, the present invention relates to a method of installing a line filter onto a system cable, wherein the line filter comprises a magnetic component, an IDC and a shunt component. The method comprises the steps of:

placing the system cable along a cable path defined through the line filter, thereby providing a magnetic coupling of the system cable to the magnetic component, and tightening the insulation displacement connector around the system cable, thereby providing a galvanic connection of the system cable to the shunt component.

The line filter used in the method may be identical to the above-described line filter such that every functional and structural feature disclosed with respect to the line filter may also be applied with respect to the method.

In the following, the invention is described in further detail with respect to the drawings.

DETAILED DESCRIPTION

Figure 1:
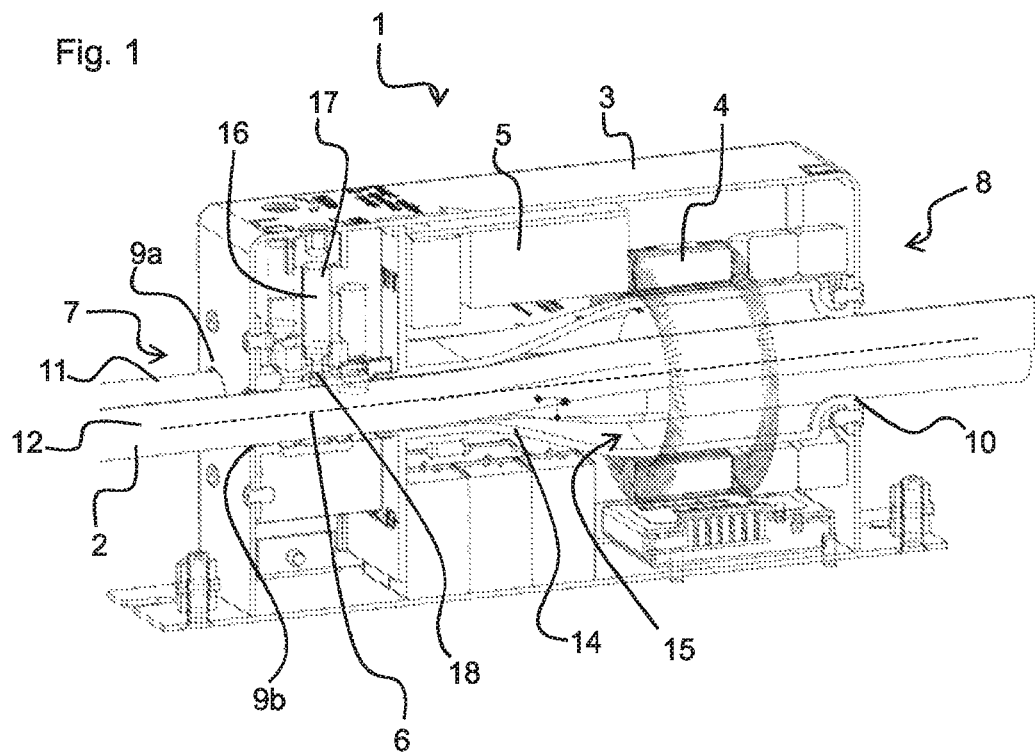
FIG. 1 shows a cross-sectional view of a line filter which is installed onto a system cable.
Figure 2:
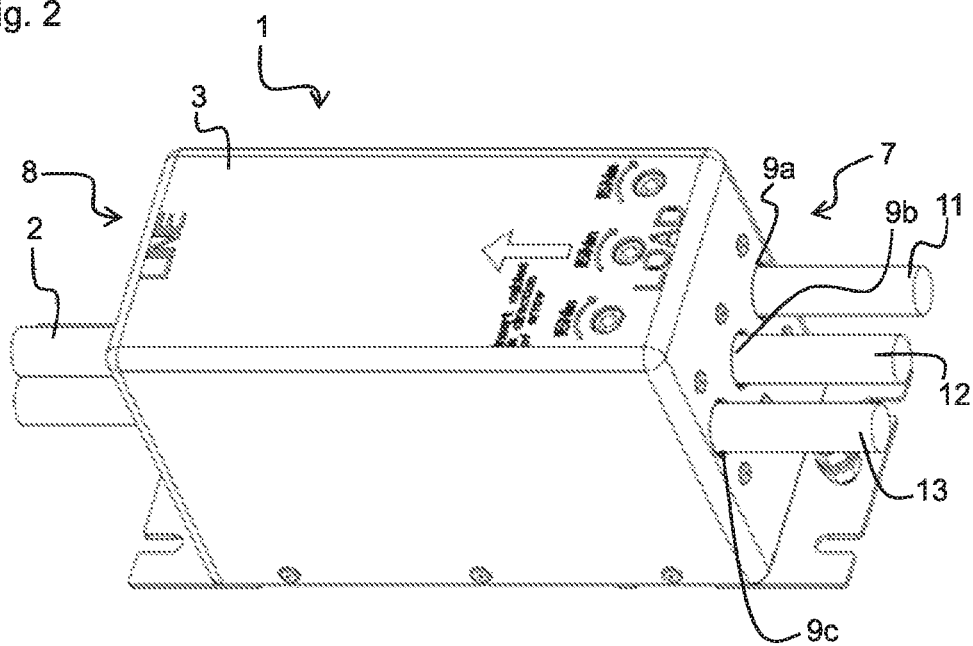
FIG. 2 shows a perspective view of the line filter installed onto the system cable.

FIG. 1 shows a cross-sectional view of a line filter 1 which is installed onto a system cable 2. FIG. 2 shows a perspective view of the line filter 1 installed onto the system cable 2.

The line filter 1 is a kind of electronic filter that is placed between an electronic device (not shown) and a line (not shown) external to it, to attenuate conducted radio frequencies (RFI), also known as electromagnetic interference (EMI) between the external line and the electronic device or between electronic devices within a system.

The line filter 1 is provided by its manufacturer without the system cable 2. At the time of installation a suitable system cable 2 is provided by an installer. Then, the line filter 1 is installed onto the system cable 2 by an installer when the line filter 1 is placed between the electronic device and the line external to it or between electronic devices within a system. The system cable 2 comprises an insulation which covers a conductive internal material, e.g. copper.

The line filter 1 comprises a housing 3. The housing 3 consists on a plastic material. The further parts of the line filter 1 are arranged inside the housing 3. The housing 3 is mountable on a system cabinet (not shown).

The line filter 1 is a low pass filter. The line filter 1 comprises magnetic components 4 configured as in-line inductors and shunt components 5, e.g. shunt capacitors. The line filter 1 is configured such that the magnetic components 4 and the shunt components 5 form a LC-low pass filter when connected to the system cable 2.

The line filter 1 defines a cable path 6 which runs through the line filter 1. In particular, the cable path 6 enters into the line filter 1 on a load side 7 and exits the line filter 1 on the line side 8. As the line filter 1 defines the cable path 6 along which the system cable 2 can be placed, the line filter 1 is free from an internal main cable to which the system cable 2 would otherwise have to be electronically connected, e.g. by field wiring terminal.

The line filter 1 comprises an aperture 9a at the load side 7 which is configured to allow entering the system cable 2 into the line filter 1 through the aperture 9a at the load side 7. Further, the line filter 1 comprises an aperture 10 at the line side 8 which is configured to allow exiting the system cable 2 from the line filter 1 through the aperture 10 at the line side 8.

In the embodiment shown in FIGS. 1 and 2, the system cable 2 comprises three phases 11, 12, 13. The line filter 1 comprises three apertures 9a, 9b, 9c arranged at the load side of the line filter. Moreover, the line filter 1 comprises only one aperture 10 arranged at the line side 8 of the line filter 1. The cable path 6 defined through the line filter 1 connects each of the three apertures 9a, 9b, 9c on the load side 7 with the one aperture 10 on the line side 8. One phase 11, 12, 13 of the system cable 2 is entered into each of the apertures 9a, 9b, 9c on the load side 7 of the line filter 1. Further, all of the phases 9a, 9b, 9c of the system cable 2 exit the line filter 1 through the one aperture 10 on the line side 8.

Further, the line filter 1 comprises a guiding element 14 which is configured to help guide the system cable 2 along the cable path 6 during the placement of the system cable 2 along the cable path 6. The guiding element 14 is shaped as a single flat tube wherein multiple phases 11, 12, 13 of the system cable 2 are guided in the same flat tube. The guiding element 14 comprises a plastic material.

In particular, the system cable 2 can be placed along the cable path 6 by being pushed into the line filter 1 from the load side 7. In this case, the guiding element 14 is configured such that the system cable 2 slides along the guiding element 14 and is, thereby, guided along the cable path 6 through the line filter 1. Once the line filter 1 has been installed onto the system cable 2, the guiding element 14 holds the system cable 2 in its position along the cable path 6.

In the embodiment shown in FIGS. 1 and 2, the line filter 1 comprises two magnetic components 4. In alternative designs, the line filter 1 can comprise one or more magnetic components.

Each of the magnetic components 4 is a ring-shaped inductor core. In particular, the magnetic components 4 are inductors which are configured to be in-line connected to the system cable by a magnetic coupling. Each of the magnetic components 4 defines an opening 15 wherein the cable path 6 passes through the openings 15. Thus, when the system cable 2 is placed along the cable path 6, the system cable 2 runs through the openings 15 of the magnetic components 4. In particular, all phases 11, 12, 13 of the system cable 2 run through the same openings 15 in the magnetic components 4.

In alternative designs, the magnetic components 4 may be of any suitable shape which provides an opening 15. In alternative designs, the phases 11, 12, 13 of system cable 2 may pass through separate magnetic components 4, i.e. one phase cable 11, 12, 13 per magnetic component 4.

When the system cable 2 is placed such that it passes through the openings 15 extending through the magnetic components 4, a magnetic coupling between the system cable 2 and the magnetic components 4 is established. In particular, the system cable 2 forms a single turn coupling with the magnetic components 4.

The line filter 1 further comprises at least one shunt component 5, e.g. a shunt capacitor.

The line filter 1 further comprises an insulation displacement connector (IDC) 16. The IDC 16 is arranged in the vicinity of the load side 7 of the line filter 1. The IDC 16 comprises a screw 17 and a conductive pin 18. In the embodiment shown in FIG. 6, the conductive pin 18 is arranged at the end of the screw 17 which faces towards the system cable 2. Thus, the screw 17 and the pin 18 are formed by a single element. The screw 17 is a metal screw. In alternative designs, the IDC 16 can be placed in any suitable location within the line filter 1.

Further, a platform 19 is arranged close to the end of the screw 17 which faces the system cable 2. The IDC 16 further comprises a cage 20. When the screw 17 is tightened, the platform 19 is configured to compress the system cable 2. The system cable 2 is mechanically fixed, e.g. clamped between the platform 19 and the cage 20, when the screw 17 is tightened. The cage 20 consists of a metal block 23 with thread to accept the screw 17 and a metal strap 24 that passes around the system cable 2.

Moreover, when the screw 17 is tightened, the conductive pin 18 pierces through the insulation of the system cable 2, thereby establishing a galvanic connection to the system cable 2. In particular, the insulation of the system cable is displaced when the conductive pin 18 pierces into the system cable 2. As the system cable 2 is compressed between the platform 19 and the cage 20, it is ensured that the pin 18 is pressed into the conductor of system cable 2 to provide a good galvanic connection to the conductive internal material of the system cable 2.

Furthermore, the IDC 16 comprises a low current connection point (not shown) which is galvanically connected to the shunt components 5. When the screw 17 is tightened, the IDC 16 provides a galvanic connection of the system cable 2 to the shunt components 5. In particular, the IDC 16 comprises a small solder or crimp lug (not shown) configured to make a wire connection to at least one shunt component 5.

The IDC 16 is configured to provide a voltage tap into the system cable 2. Accordingly, the same voltage as in the system cable 2 is also applied to the shunt component 5 when the galvanic connection is established. Further, the galvanic connection is configured to only draw a small shunt current through the conductive pin 18 from the system cable 2. The shunt current may be an order of magnitude, or more, smaller than the power current flowing through the system cable 2. The shunt current may be in the range of 0.1 A to 10 A.

Moreover, the IDC 16 comprises a plastic housing 21 which provides an insulation of the IDC 16. The IDC 16 is configured to provide a gas-tight seal of the system cable 2. The gas-tight seal is formed by the pressure of the platform 19 and cage 20 on the insulation of the system cable 2 and by the pressure applied by the displaced insulation of the system cable 2 on the conductive pin 18.

The depth by which the pin 18 is designed to enter into the system cable 2 can be adjusted to provide different conductivity characteristics of the galvanic connections. Pin 18 may protrude into the conductor of system cable 2 by a fraction of a millimeter or several millimeters.

The system cable 2 comprises three phases 11, 12, 13. The line filter 1 comprises three IDCs 16. Each of the IDCs 16 is assigned to one phase 11, 12, 13 of the system cable 2. In particular, each of the IDCs 16 is configured to galvanically connect one of the phases 11, 12, 13 of the system cable 2 to the shunt components 5.

In alternative designs, the system cable 2 may comprise other numbers of phases. In this case, the line filter 1 comprises one IDC 16 and one aperture 9a on the load side 7 per phase of the system cable 2.

In alternative designs, more than one IDC 16 may be connected to one phase of the system cable 2. Thereby, multiple stages of shunt components can be connected to system cable 2. Alternatively or additionally, each IDC 16 may comprise more than one conductive pin 18 which is configured to pierce into the system cable 2 when the screw 17 of the respective IDC 16 is tightened. This design also allows to draw a higher shunt current from the system cable 2 through the IDC 16.

Figure 3:
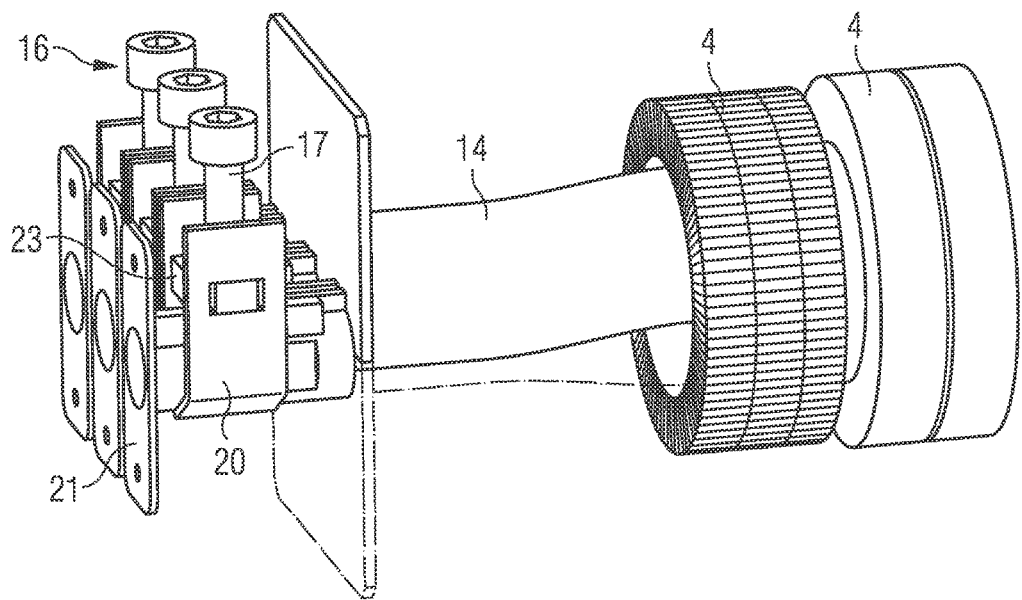
FIGS. 3 and 4 show details of the magnetic components, cable guide and IDC connectors in a perspective view.
Figure 4:
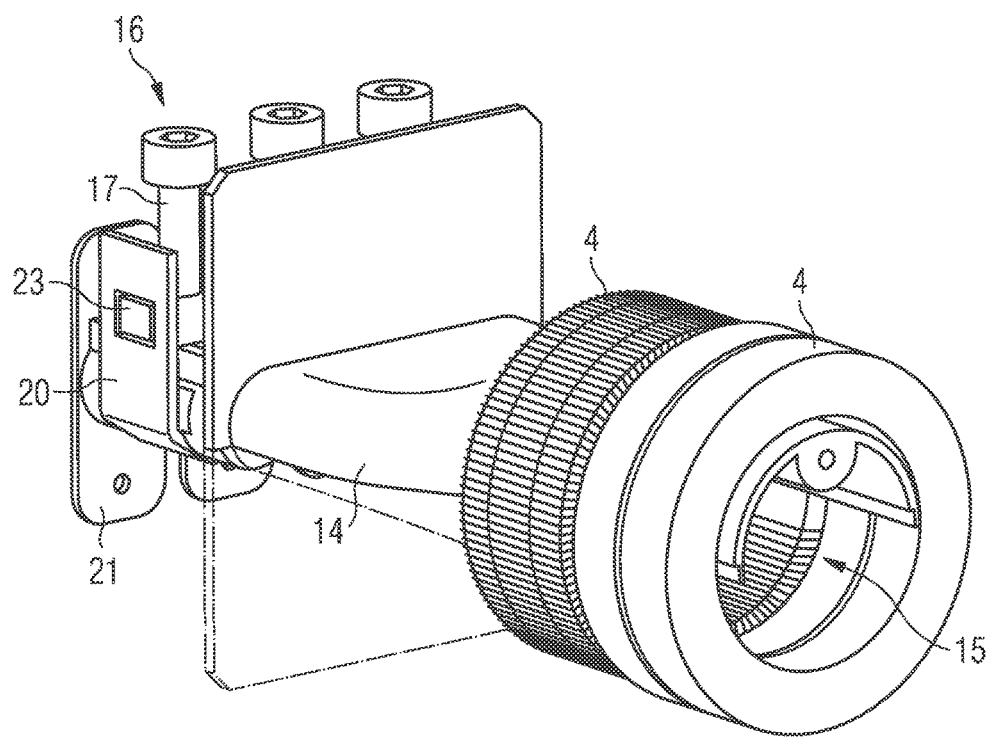

FIGS. 3 and 4 show details of the line filter 1. In particular, neither the housing 3 of the line filter 1 nor the shunt components 5 are shown in FIGS. 3 and 4 to improve comprehensibility. In particular IDC connectors 16, cable guide 14 and magnetic components 4 are all shown.

Figure 5:
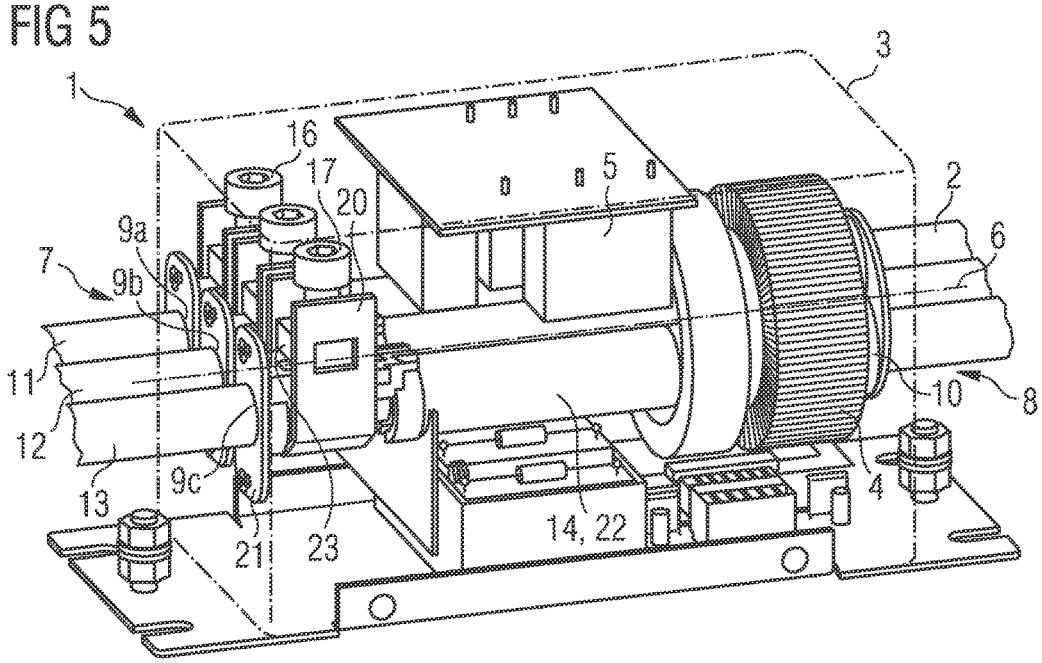
FIG. 5 shows a perspective view of an alternative design of the line filter, showing IDC connectors, magnetic components, shunt components and cable guides.

FIG. 5 shows a perspective view of another alternative design of the line filter 1. In FIG. 5 the housing 3 is shown as partially see-through to improve comprehensibility.

The design shown in FIG. 5 differs from the previously described design in the design of the guiding element 14. In the design shown in FIG. 5, the guiding element 14 comprises multiple separate tubes 22 wherein a tube 22 is provided for each of the phases 11, 12, 13 of the system cable 2.

Figure 6:
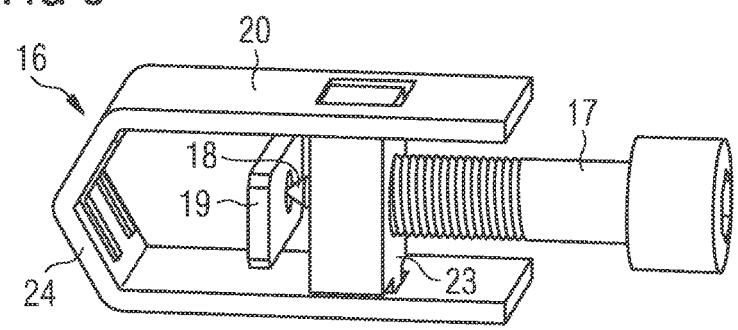
FIG. 6 shows a perspective view of an insulation displacement connector.

FIG. 6 shows a perspective view of the above discussed IDC 16.

Figure 7:
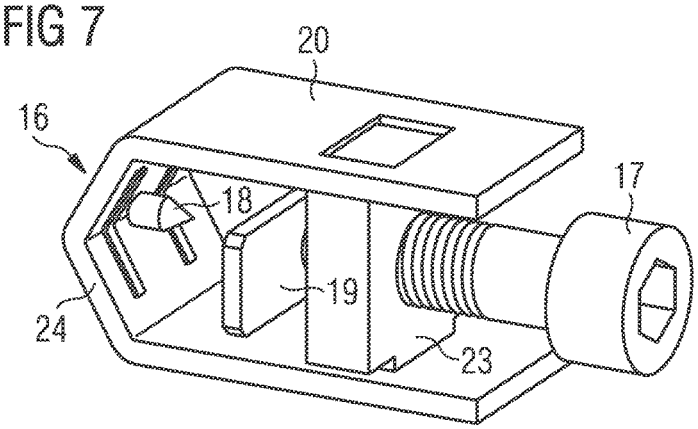
FIG. 7 shows a perspective view of an alternative insulation displacement connector.

FIG. 7 shows an alternative design of the IDC 16. In the IDC 16 shown in FIG. 7, the conductive pin 18 is arranged at the side of the cage 20 which is opposite to the screw 17. However, the basic functionality of the IDC 16 is not changed. When the screw 17 is tightened, the system cable 2 is thereby compressed between the platform 19 and the cage 20 and the conductive pin 18 is forced to pierce into the system cable 2 at the same time.

In another alternative design, the IDC 16 comprises two conductive pins 18. A first conductive pin 18 is arranged on the end of the screw 17 which faces towards the system cable 2 as also shown in the embodiment of FIG. 6. A second conductive pin 18 is arranged at the side of the cage 20 which is opposite to the screw 17 as also shown in the embodiment of FIG. 7. By providing two conductive pins 18, a higher shunt current can be drawn from the system cable 2. No modification of other functions are required.

REFERENCE NUMERALS 1 line filter
2 system cable
3 housing
4 magnetic component
5 shunt component
6 cable path
7 load side
8 line side
9a, 9b, 9c aperture at the load side
10 aperture at the line side
11, 12, 13 phase of the system cable
14 guiding element
15 opening
16 insulation displacement connector (IDC)
17 screw
18 conductive pin
19 platform
20 cage
21 plastic housing of the IDC
22 tube
23 block
24 strap

We claim:

1. A line filter, which is configured to be installed onto a system cable,
    wherein the line filter comprises a magnetic component,
    wherein the line filter defines a cable path through the line filter,
    wherein the line filter is configured to allow a placement of the system cable along the cable path at the time of an installation, thereby providing a magnetic coupling of the system cable to the magnetic component,
    wherein the line filter comprises at least one insulation displacement connector and a shunt component wherein the at least one insulation displacement connector is configured to be tightened at the time of the installation, thereby providing a galvanic connection of the system cable to the shunt component,
    wherein the at least one insulation displacement connector comprises a screw and at least one conductive pin which is configured to pierce into the system cable when the screw is tightened, and wherein the pin is either arranged at the end of the screw which is configured to face towards the system cable, or the pin is arranged such that it is on the side of the system cable which is opposite to the screw when the line filter is installed onto the system cable.

2. The line filter according to claim 1, wherein the line filter comprises an aperture which is configured to allow the placement of the system cable along the cable path by pushing the system cable through the aperture at the time of the installation.

3. The line filter according to claim 1, wherein the line filter comprises a housing, and wherein the insulation displacement connector is configured to pierce into the system cable at a position inside the housing.

4. The line filter according to claim 1, wherein the insulation displacement connector is configured to provide a strain-relief when connected to the system cable.

5. The line filter according to claim 1, wherein the conductive pin is configured to pierce into the system cable and protrude into the system cable with a depth in the range of a 0.01 mm to 20 mm.

6. The line filter according to claim 1, wherein the magnetic component is ring-shaped and comprises an opening, and wherein the cable path passes through the opening of the magnetic component.

7. The line filter according to claim 1, wherein the line filter is free from internal conductor windings.

8. The line filter according to claim 1, wherein the at least one insulation displacement connector is configured to draw a shunt current from the system cable through the galvanic connection of the system cable to the shunt component, and
wherein the shunt current is lower than a current flowing through the system cable.

9. The line filter according to claim 8, wherein the shunt current is in the range of 0.1 A to 10 A.

10. The line filter according to claim 1, the at least one insulation displacement connector comprising multiple insulation displacement connectors wherein each of the insulation displacement connectors is configured to be tightened at the time of the installation, thereby providing galvanic connections of the system cable to the shunt component.

11. The line filter according to claim 1, which is configured to be installed onto a system cable which comprises at least one phase,
wherein the line filter is configured such that all phases of the system cable are magnetically connected to the magnetic component when the system cable is placed along the cable path, and
wherein the line filter is configured to allow galvanically connecting each phase of the system cable to the at least one insulation displacement connector.

12. The line filter according to claim 1, which comprises a guiding element which is configured to mechanically guide the system cable along the cable path during the placement of the system cable along the cable path and which is configured to hold the system cable in the cable path once the system cable is placed along the cable path.

13. The line filter according to claim 1, wherein the line filter is configured to allow deinstallment of the line filter from the system cable.

14. An assembly comprising a line filter and a system cable,
wherein the line filter is configured to be installed onto the system cable,
wherein the line filter comprises a magnetic component,
wherein the line filter defines a cable path through the line filter,
wherein the line filter is configured to allow a placement of the system cable along the cable path at the time of an installation, thereby providing a magnetic coupling of the system cable to the magnetic component,
wherein the line filter comprises an insulation displacement connector and a shunt component wherein the insulation displacement connector is configured to be tightened at the time of the installation, thereby providing a galvanic connection of the system cable to the shunt component,
wherein the insulation displacement connector is configured to draw a shunt current from the system cable through the galvanic connection of the system cable to the shunt component,
wherein the shunt current is lower than a current flowing through the system cable, and
wherein the shunt current is in the range of 0.1 A to 10 A.

15. A method of installing a line filter onto a system cable, the line filter comprising a magnetic component, an insulation displacement connector and a shunt component, the method comprising the steps of:
placing the system cable along a cable path defined through the line filter, thereby providing a magnetic coupling of the system cable to the magnetic component; and
tightening the insulation displacement connector around the system cable, thereby providing a galvanic connection of the system cable to the shunt component,
wherein the insulation displacement connector comprises a screw and at least one conductive pin which is configured to pierce into the system cable when the screw is tightened, and
wherein the pin is either arranged at the end of the screw which is configured to face towards the system cable, or the pin is arranged such that it is on the side of the system cable which is opposite to the screw when the line filter is installed onto the system cable.

* * * * *